United States Patent
Zhi et al.

(10) Patent No.: US 9,755,619 B2
(45) Date of Patent: Sep. 5, 2017

(54) RAIL-TO-RAIL COMPARATOR WITH SHARED ACTIVE LOAD

(71) Applicant: FREESCALE SEMICONDUCTOR, INC., Austin, TX (US)

(72) Inventors: Hao Zhi, Suzhou (CN); Jie Jin, Suzhou (CN); Yang Wang, Suzhou (CN); Jianzhou Wu, Suzhou (CN)

(73) Assignee: NXP USA, INC., Austin, TX (US)

(*) Notice: Subject to any disclaimer, the term of this patent is extended or adjusted under 35 U.S.C. 154(b) by 0 days.

(21) Appl. No.: 15/256,571

(22) Filed: Sep. 4, 2016

(65) Prior Publication Data

US 2017/0117880 A1    Apr. 27, 2017

(30) Foreign Application Priority Data

Oct. 21, 2015  (CN) .......................... 2015 1 0874270

(51) Int. Cl.
*H03K 3/012* (2006.01)
*H03K 5/24* (2006.01)

(52) U.S. Cl.
CPC ........... *H03K 3/012* (2013.01); *H03K 5/2481* (2013.01)

(58) Field of Classification Search
CPC ....... H03L 7/0995; H03L 7/148; H03L 1/022; H03L 7/0818; H03L 7/095; H03K 17/163; H03K 17/164; H03K 17/166; H03K 17/167; H03K 3/0315; H03K 3/0375; H03K 3/356113; H03K 3/356156; H03K 3/356173; H03K 5/133

USPC ......................................... 327/63, 64, 65, 66
See application file for complete search history.

(56) References Cited

U.S. PATENT DOCUMENTS

| | | | |
|---|---|---|---|
| 5,142,244 A | 8/1992 | Glica et al. | |
| 6,630,847 B2 | 10/2003 | Hunt | |
| 7,157,970 B2 | 1/2007 | Dawes | |
| 7,576,572 B2 | 8/2009 | Ball | |
| 7,764,123 B2 | 7/2010 | Kimura | |
| 8,289,077 B2 | 10/2012 | Bruin | |
| 8,638,126 B2 | 1/2014 | Lo | |
| 8,643,443 B1 | 2/2014 | Wang | |
| 8,773,174 B2 | 7/2014 | Wang et al. | |
| 2001/0052802 A1* | 12/2001 | Griffin | H03F 3/45264 327/65 |
| 2011/0025654 A1* | 2/2011 | Nishimura | H03F 3/3022 345/204 |
| 2011/0298541 A1 | 12/2011 | Shi | |

OTHER PUBLICATIONS

William Redman-White, "A High Bandwidth Constant gm arid Slew-Rate Rail-to-Rail CMOS input Circuit and its Application to Analog Cells for Low Voltage VLSI Systems", IEEE Journal of Solid-State Circuits, vol. 32, No. 5, May 1997.

(Continued)

*Primary Examiner* — John Poos
(74) *Attorney, Agent, or Firm* — Charles E. Bergere

(57) ABSTRACT

A rail-to-rail comparator circuit includes NMOS and PMOS differential input stages with associated loads that are coupled to a shared-load stage. The shared-load stage is coupled to an output stage that includes two active devices. By sharing the load stage between the two input stages, the comparator has a relatively small circuit area, low power draw, and low propagation delay with rail-to-rail input common-mode voltage range.

15 Claims, 4 Drawing Sheets

(56) References Cited

OTHER PUBLICATIONS

Klaas-Jan De Langen and Johan H Huijsing, "Compact Low-Voltage Power-Efficient Operational Amplifier Cells for VLSI", IEEE Journal of Solid-State Circuits, vol. 33, No. 10, Oct. 1998.
Guo-Ding Dai, Peng Huang, Ling Yang and Bo Wang, "A Constant Gm CMOS Op-Amp with Rail-to-Rail input/output stage", 978-1-4244-5798-4/10/$26,00 © 2010 IEEE.
Vincenzo Stornelli, Giuseppe Ferri, and Andrea De Marcellis, "A fully-differential Symmetrical OTA-based rail-to-rail Switched Buffer", IEEE 1-4244-1001-0/07, 2007.
Wei-Shang Chu and K. Wayne Current, "A Rail-To-Rail Input-Range CMOS Voltage Comparator", IEEE 0-7803-3694-1/97, 1997.

* cited by examiner

RAIL-TO-RAIL COMPARATOR WITH SHARED ACTIVE LOAD

BACKGROUND

The present invention relates generally to integrated circuits and, more particularly, to a rail-to-rail comparator circuit.

Comparators are a common type of circuit used in many applications, some of which require that the comparator operate over a wide common-mode input voltage range. As improvements in technology have led to lower device supply voltages and smaller threshold voltage ratios, integrated circuit designers have found it increasingly more difficult to design and manufacture comparators that operate over a wide common-mode input voltage range. Typically, as the common-mode voltage at the input of the comparator approaches either the positive supply rail or the negative supply rail of the device, the comparator ceases to function properly, resulting in an output signal that is not indicative of the signals at the input of the comparator.

One known comparator design, discussed in U.S. Pat. No. 7,576,572 implements a rail-to-rail comparator by paralleling two complementary, symmetrical, operational transconductance amplifiers (OTAs). The design, however, has redundant components and uses more active loads than necessary. Furthermore, the parasitic capacitances introduced by the redundant loads slow down the comparator.

Another known comparator design, discussed in "A rail-to-rail input-range CMOS voltage comparator," 1997 Proceedings of the 40th Midwest Symposium on Circuits and Systems, Vol. 1, implements a rail-to-rail comparator using two symmetrical OTAs with a cross-coupled load. In this design, the cross-coupled load can increase the DC gain of the circuit resulting in poor common-mode voltage rejection. Further, propagation delay of the design is increased if the internal node is clamped to a power or ground rail. Additionally, this circuit requires switches to overcome the circuit's inability to automatically manage both high and low common-mode voltages. Switches add more parasitic capacitance.

It would be desirable to provide a comparator that is operational over a full rail-to-rail common-mode input voltage range, satisfies high-speed operational requirements, achieves low power consumption, and places few demands on the manufacturing process.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale. For example, the thicknesses of layers and regions may be exaggerated for clarity.

DETAILED DESCRIPTION

Figure 1:
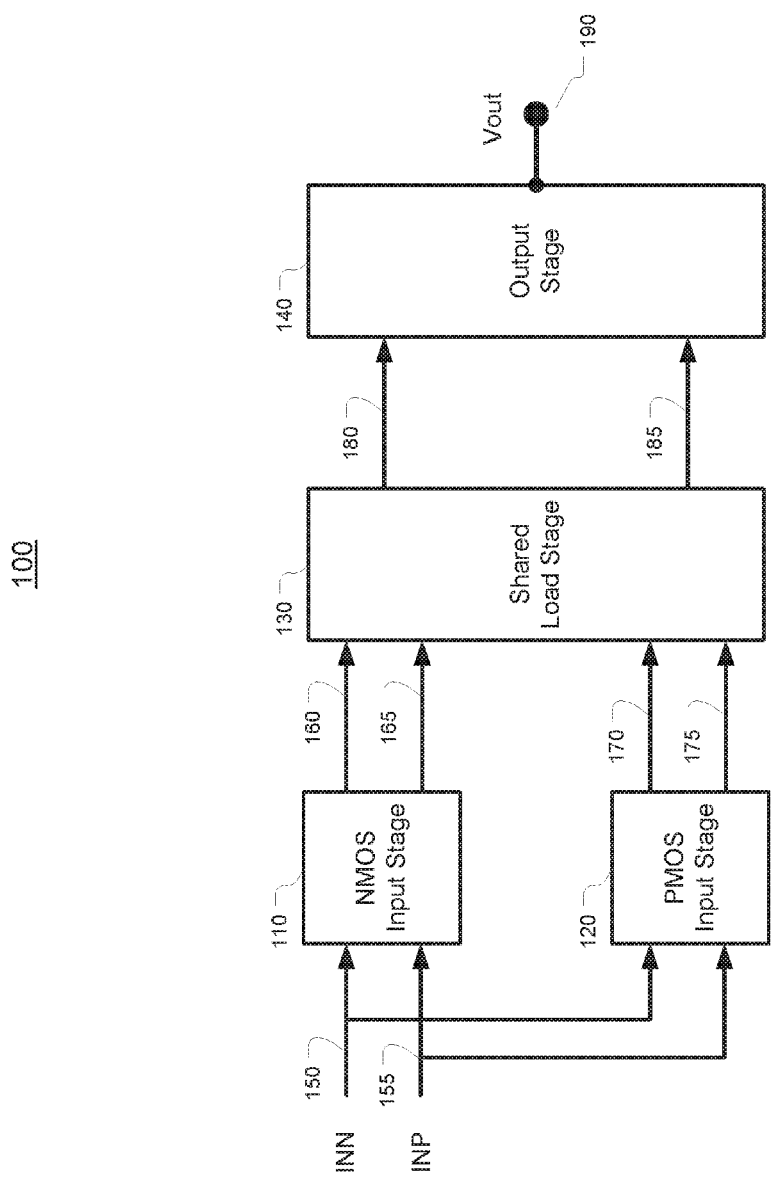
FIG. 1 is a schematic block diagram of a comparator according to an embodiment of the present invention.

Detailed illustrative embodiments of the present invention are disclosed herein. However, specific structural and functional details disclosed herein are merely representative for purposes of describing example embodiments of the present invention. The present invention may be embodied in many alternative forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In one embodiment the invention is a comparator that includes an n-type input stage connected to receive a differential input signal that has a negative input component and a positive input component, a p-type input stage connected to receive the differential input signal, a shared-load stage connected to both the n-type input stage and the p-type input stage and comprising load devices that are shared by both the n-type input stage and the p-type input stage, and an output stage connected to the shared-load stage and providing a comparator output signal indicative of relative voltage levels of the differential input signal.

In another embodiment the present invention provides a comparator that includes an NMOS-input stage comprised of a differential pair of source-coupled n-type transistors and one or more NMOS-input stage active-load transistors, a first of the source-coupled n-type transistors electrically connected by way of its gate to a positive differential input node and a second of the n-type transistors electrically connected at its gate to a negative input node, a PMOS-input stage comprising a differential pair of source-coupled p-type transistors and one or more PMOS-input stage active-load transistors, a first of the source-coupled p-type transistors being electrically connected by way of its gate to the positive differential input node and a second of the source-coupled p-type transistors being electrically connected by way of its gate to the negative input node, a shared-load stage comprising active-load transistors that are electrically connected between the PMOS-input stage and the NMOS-input stage; and an output stage electrically connected to the shared-load stage.

In one embodiment, the output stage has just two transistors. In operation, when the NMOS-input stage is active, it causes current to be drawn through at least one of the active-load transistors within the shared-load stage and when the PMOS-input stage is active, it causes current to be drawn through the same at least one of the active-load transistors within the shared-load stage.

Referring now to FIG. 1, a block diagram of a comparator 100 according to an embodiment of the present invention is shown. The comparator 100 includes NMOS and PMOS input stages 110 and 120, a shared-load stage 130, and an output stage 140. Each of the NMOS and PMOS input stages 110 and 120 is connected to a negative differential input node INN 150 and a positive differential input node INP 155.

The NMOS-input stage 110 is electrically connected to the shared-load stage 130 via connections 160 and 165, while the PMOS-input stage 120 is electrically connected to the shared-load stage 130 via connections 170 and 175. The shared-load stage 130 is electrically connected to the output stage 140 via connections 180 and 185. The output stage 140 is connected to an output node Vout 190.

Each of the stages includes power supply (Vdd) and ground connections (not shown) as appropriate. In various implementations, Vdd will typically be between 1.8 and 3.6 volts and may be referred to herein as the "upper rail" or "power rail." Meanwhile, the ground connection will be close to zero volts and may be referred to herein as the "lower rail" or "ground rail."

The comparator 100 operates generally as follows. If the voltage of the positive input INP 155 is higher than the voltage of the negative input INN 150, then the output Vout 190 of the comparator 100 will be driven high (i.e., close to the upper rail). Alternatively, if the voltage of the positive input INP 155 is less than the voltage of the negative input INN 150, then the output Vout 190 of the comparator 100 will be driven low (i.e., close to the lower rail).

Use of both NMOS and PMOS input stages 110 and 120 allows the comparator 100 to operate correctly when a common-mode voltage (CMV) associated with the inputs INN 150 and INP 155 is close to the upper rail or close to the lower rail. In particular, if the CMV of the inputs INN 150 and INP 155 is close to the upper rail, then the PMOS input stage 120 will be inactive, and parts of the NMOS input stage 110 and the shared-load circuit 130 will be responsible for driving the output voltage Vout 190 of the output stage 140 to the power rail or ground rail depending on the voltages of the inputs INN 150 and INP 155 relative to each other.

Similarly, if the CMV of the inputs INN 150 and INP 155 is close to the ground rail, then the NMOS input stage 110 will be inactive, and parts of the PMOS input stage 120 and the shared-load circuit 130 will be responsible for driving the output voltage Vout 190 of the output stage 140 to the power rail or ground rail depending on the voltages of the inputs INN 150 and INP 155 relative to each other.

Figure 2:
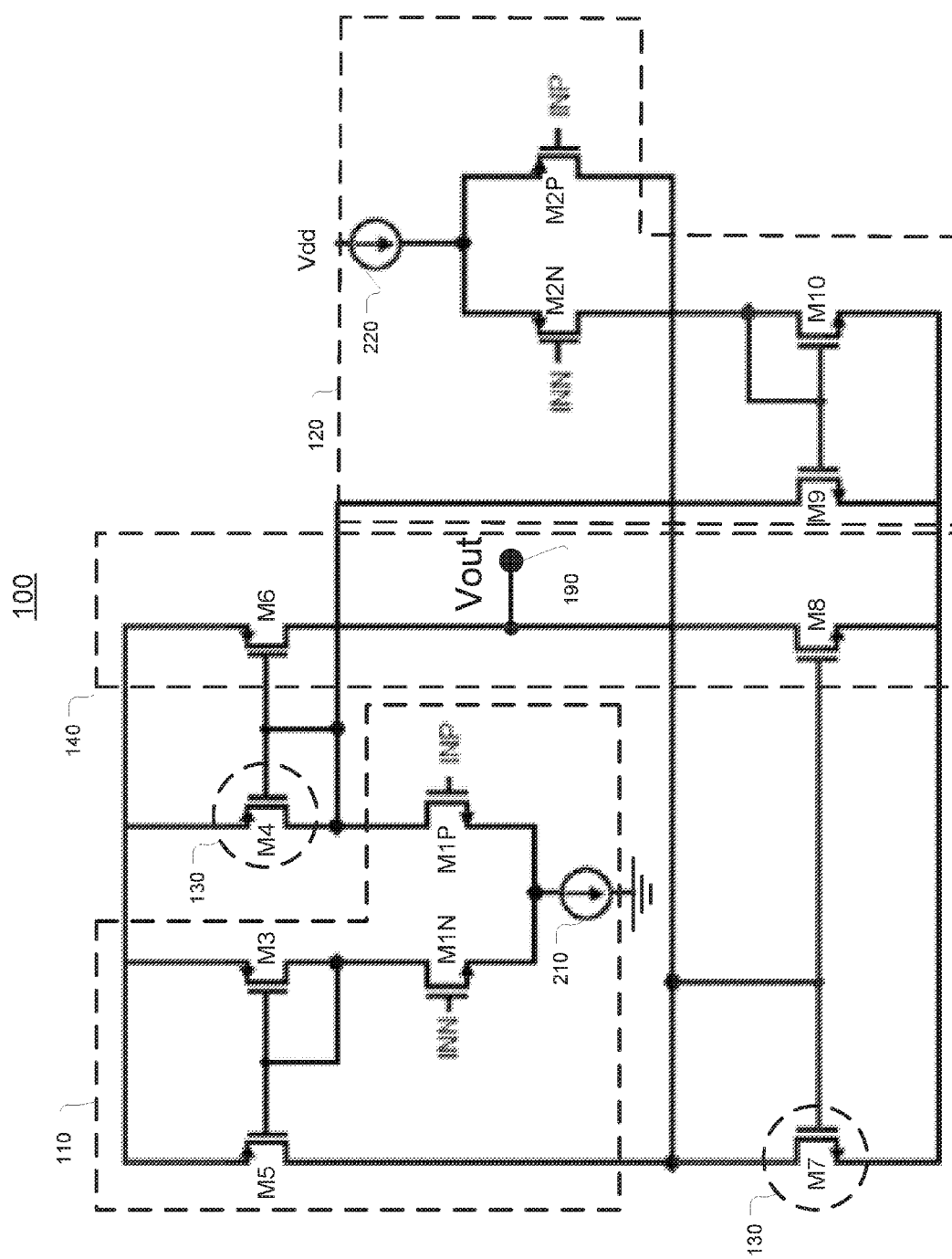
FIG. 2 is a schematic circuit diagram of the comparator of FIG. 1 according to an embodiment of the present invention.

FIG. 2 is a schematic circuit diagram of the comparator 100 of FIG. 1 according to one embodiment of the present invention.

The NMOS input stage 110 includes input n-channel field-effect transistors (FETs) M1N and M1P, as well as active-load p-channel FETs M3 and M5. The PMOS input stage 120 includes input p-channel FETs M2N and M2P, as well as active-load n-channel FETs M9 and M10. The shared-load stage 130 includes p-channel FET M4 and n-channel FET M7; and the output stage 140 includes p-channel FET M6 and n-channel FET M8.

Within the NMOS input stage 110, the n-channel FETs M1N and M1P are electrically joined at their source nodes to a current sink 210. The gate node of the FET M1N is electrically connected to the negative differential input node INN, and the gate node of the FET M1P is electrically connected to the positive differential input node INP. The drain node of the FET M1N is electrically connected to the drain node of the p-channel FET M3 and in common with the gate nodes of the FETs M3 and M5.

During operation of the comparator 100, if the CMV of the differential inputs INN and INP to the NMOS input stage 110 is substantially near the midpoint between the power and ground rail voltages, and the voltage of the INP node is higher than the voltage of the INN node, then more current will be drawn through the FET M1P than through the FET M1N. Correspondingly, more current will be drawn through the FET M4 than through the FET M3. This higher current will be mirrored to the FET M6 in the output stage 140, and the output Vout 190 will be pulled up toward the power rail.

Alternatively, if the voltage of the INP node is lower than the voltage of the INN node, then more current will be drawn through the FET M1N than through the FET M1P. Correspondingly, more current will be drawn through the FET M3 than through the FET M4. This current will be mirrored to the FETs M5, M7, and M8 in the output stage 140, and the output Vout 190 will be pulled down to the ground rail.

Within the PMOS input stage 120, the p-channel FETs M2N and M2P are electrically joined at their source nodes to a current source 220. The gate node of the FET M2N is electrically connected to the negative differential input node INN, and the gate node of the FET M2P is electrically connected to the positive differential input node INP. The drain node of the FET M2N is electrically connected to the drain node of the n-channel FET M10 and in common with the gate nodes of the n-channel FETs M9 and M10.

During operation of the comparator 100, if the CMV of the differential inputs INN and INP to the PMOS-input stage 120 is substantially near the midpoint between the power and ground rail voltages, and the voltage of the INP node is higher than the voltage of the INN node, then more current will be drawn through the FET M2N than through the FET M2P. Correspondingly, more current will be drawn through the FETs M10, M9, M4, and M6 than through the FETs M7 and M8. The higher current through the FET M6 will cause the output Vout 190 to be pulled up toward the power rail.

Alternatively, if the voltage of the INP node is lower than the voltage of the INN node, then more current will be drawn through the FET M1P than through the FET M1N. Correspondingly, more current will be drawn through the FET M7 than through the FET M10, and through mirroring, more current will be drawn through the FETs M5, M7, and M8 than through the FET M6. The higher current through the FET M8 will pull the output Vout 190 low toward the ground rail.

Note that the FETs M4 and M7 serve as active loads for both the NMOS and PMOS input stages 110 and 120, respectively, and thus constitute shared loads for those input stages. This is in contrast with conventional designs, which use dual, parallel PMOS and NMOS input stages with independent loads. Such prior-art designs suffer from component redundancy and longer propagation delays.

If the CMV of the differential inputs INN and INP is greater than (Vdd$-V_{dsatP}-V_{thP}$), then the PMOS input stage 120 is shut down, and operation of the comparator 100 is controlled by the NMOS input stage 110, the shared-load stage 130, and the output stage 140. $V_{dsatP}$ is the minimum voltage drop across the current source 220 when current source 220 is operating properly, and $V_{thP}$ is the threshold voltage of the PMOS transistor.

Figure 3:
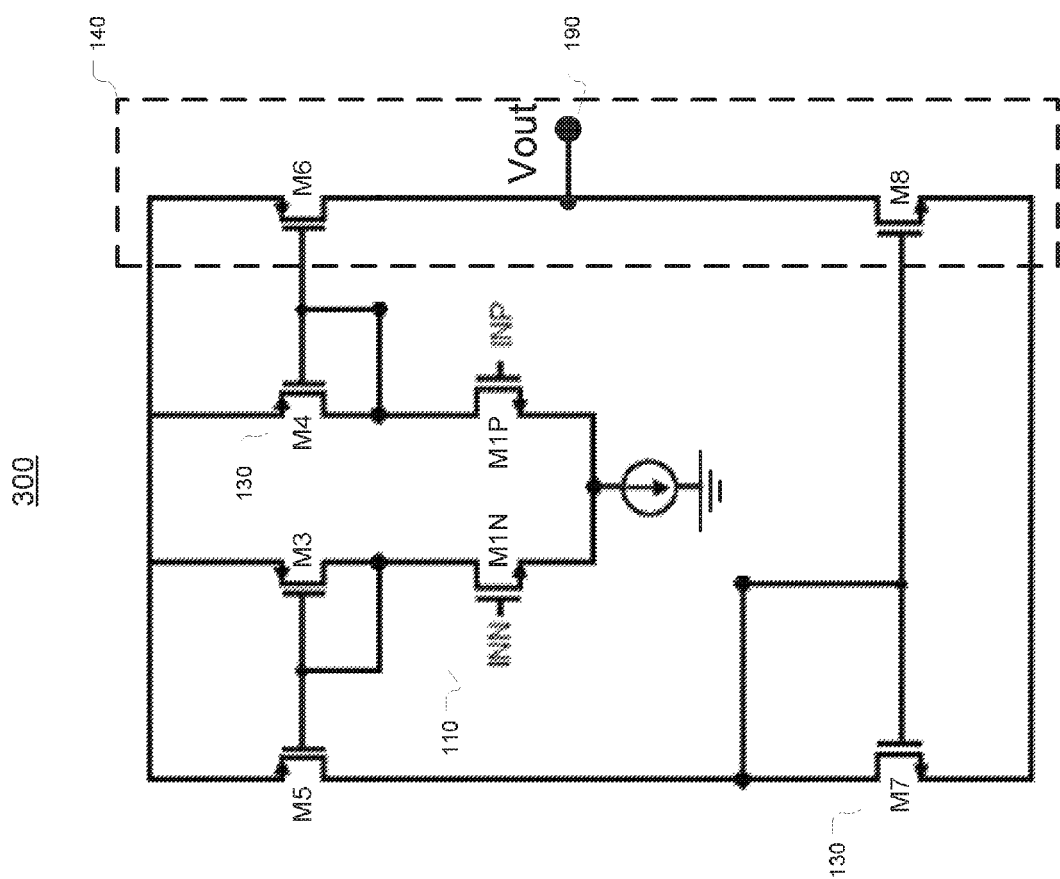
FIG. 3 is a schematic circuit diagram of a portion of the comparator of FIG. 2 that is operational when the common-mode voltage of the inputs INN and INP is close to the power rail.

FIG. 3 is a schematic circuit diagram of the portion 300 of the comparator 100 of FIG. 2 that is operational when the CMV of the inputs INN and INP is close to the power rail.

The portion 300 includes the NMOS input stage 110, the shared-load stage 130, and the output stage 140. Notably, the inactive PMOS input stage 120 is omitted.

If the CMV is high, then the portion 300 performs substantially as described above with respect to the operation of the NMOS input stage 110 of the comparator 100.

In particular, if the CMV of the differential inputs INN and INP to the NMOS input stage 110 is near the power rail voltage, and the voltage of the INP node is higher than the voltage of the INN node, then more current will be drawn through the FET M1P than through the FET M1N. Correspondingly, more current will be drawn through the FET M4 than through the FET M3. This higher current will be mirrored to the FET M6 in the output stage 140, and the output Vout 190 will be pulled up toward the power rail.

Alternatively, if the voltage of the INP node is lower than the voltage of the INN node, then more current will be drawn through the FET M1N than through the FET M1P. Correspondingly, more current will be drawn through the FET M3 than through the FET M4. This current will be mirrored to the FETs M5, M7, and M8 in the output stage 140, and the output Vout 190 will be pulled down to the ground rail.

As noted, the PMOS input stage 120 and its non-shared active loads are inoperative. This contributes to the fast propagation times and low-power operation of the comparator 100.

Referring back to the comparator circuit 100 of FIG. 2, if the CMV of differential inputs INN and INP is less than $V_{dsatN}+V_{thN}$), then the NMOS input stage 110 is effectively shut down, and operation of the comparator 100 is controlled by the PMOS input stage 120, the shared-load stage 130, and the output stage 140. $V_{dsatN}$ is the minimum voltage drop across the current sink 210 when the current sink 210 is operating properly, and $V_{thN}$ is the threshold voltage of NMOS transistor.

Figure 4:
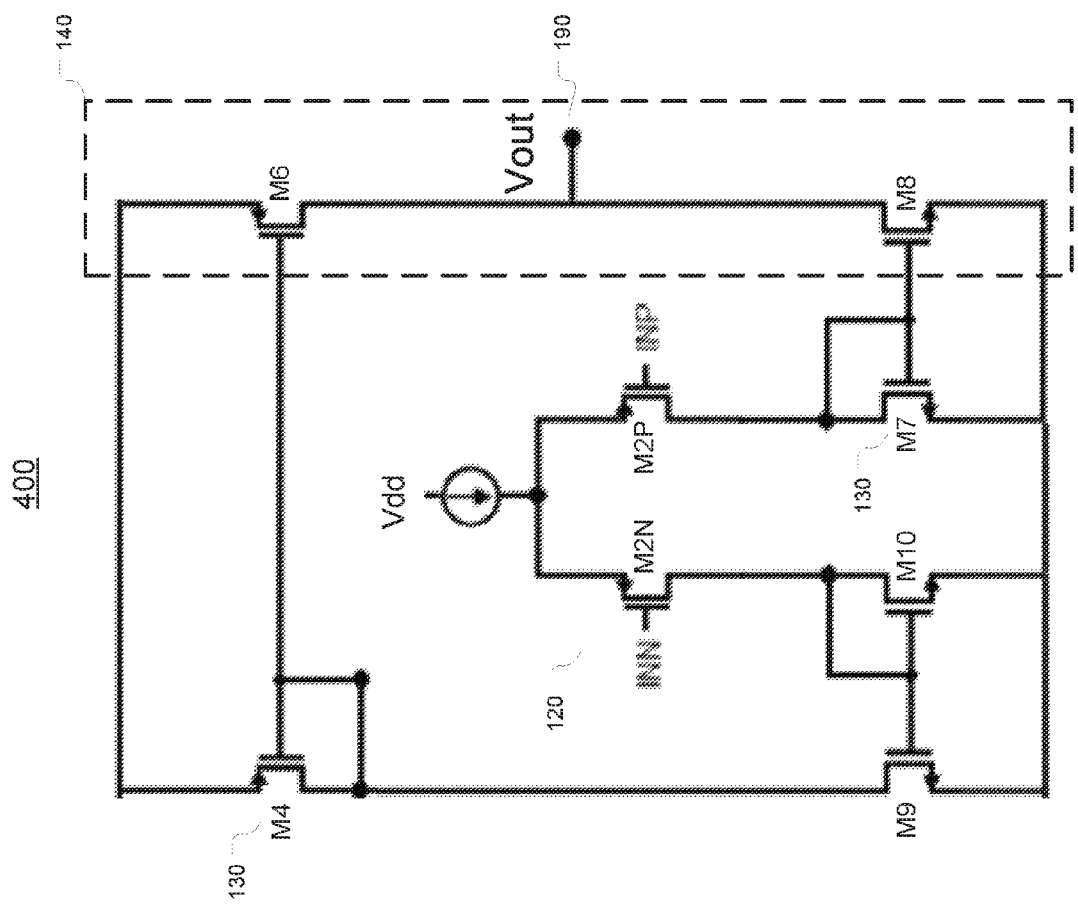
FIG. 4 is a schematic circuit diagram of a portion of the comparator of FIG. 2 that is operational when the common-mode voltage of the inputs INN and INP is close to the ground rail.

FIG. 4 is a schematic circuit diagram of the portion 400 of the comparator 100 of FIG. 2 that is operational when the CMV of the inputs INN and INP is close to the ground rail.

The portion 400 includes the PMOS input stage 120, the shared-load stage 130, and the output stage 140. Notably, the inactive NMOS input stage 110 is omitted.

If the CMV is low, then the portion 400 performs substantially as described above with respect to the operation of the PMOS input stage 120 of the comparator 100.

In particular, if the CMV of the differential inputs INN and INP to the PMOS input stage 120 is near the ground rail voltage, and the voltage of the INP node is higher than the voltage of the INN node, then more current will be drawn through the FET M2N than through the FET M2P. Correspondingly, more current will be drawn through the FET M10 than through the FET M7. This higher current will be mirrored to the FETs M9, M4, and M6 in the output stage 140, and the output Vout 190 will be pulled up toward the power rail.

Alternatively, if the voltage of the INP node is lower than the voltage of the INN node, then more current will be drawn through the FET M2P than through the FET M2N. Correspondingly, more current will be drawn through the FET M7 than the FET M10 (and correspondingly via mirroring through the FETs M9, M4, and M6). Thus, more current will be copied to the FET M8 than to the FET M6 of the output stage 140, and the output Vout 190 will be pulled down to the ground rail.

As noted, the NMOS input stage 110 and its non-shared active loads are inoperative in this operating mode. This contributes to the fast propagation times and low-power operation of the comparator 100.

Note that the output stage 140 of the comparator 100, in all operating modes, comprises just two FETs M6 and M8. This arrangement provides for very low parasitic capacitance, lower die size, and shorter propagation time.

Within the claims, a p-type transistor may be considered synonymous with a p-channel transistor and an n-type transistor may be considered synonymous with a n-channel transistor.

Unless stated otherwise, terms such as "first," "second," and "third" are used to arbitrarily distinguish between the elements such terms describe. Thus, these terms are not necessarily intended to indicate temporal or other prioritization of such elements and are not to be interpreted as necessarily referencing similarly numbered elements in the embodiments of the specification.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The invention claimed is:

1. A comparator, comprising:
a n-type input stage connected to receive a differential input signal comprising a negative input component and a positive input component, wherein the n-type input stage comprises a differential pair of input n-channel transistors having their sources connected to a current sink, and a pair of active load p-channel transistors having their sources connected together, and their gates connected together and to a drain of a first one of the input n-channel transistors;
a p-type input stage connected to receive the differential input signal, wherein the p-type input stage comprises a differential pair of input p-channel transistors having their sources connected to a current source, and a pair of active load n-channel transistors having their sources connected together, and their gates connected together and to a drain of a first one of the input p-channel transistors;
a shared-load stage connected to both the n-type input stage and the p-type input stage and comprising load devices that are shared by both the n-type input stage and the p-type input stage; and
an output stage connected to the shared-load stage, wherein the output stage comprises a first output transistor having a source connected to the sources of the active load p-channel transistors and a gate connected to the shared-load stage, and a second output transistor having a source connected to the sources of the active load n-channel transistors and a gate connected to the shared-load stage, and configured to present a comparator output signal indicative of relative voltage levels of the differential input signal at a node between the drains of the first and second output transistors,
wherein the p-type input stage is configured to be inactive, if a common-mode voltage of the differential input signal is substantially close to a power rail of the comparator, and the n-type input stage is configured to be inactive, if the common-mode voltage of the differential input signal is substantially close to a ground rail of the comparator.

2. The comparator of claim 1, wherein
the first n-type transistor of the input n-channel transistors has a gate node connected to receive the positive input component, and a second n-type transistor of the input n-channel transistors has a gate node connected to receive the negative input component; and the p-channel active-load transistors are connected to a drain node of one of the first and second n-type transistors, wherein at least one of the active-load transistors is connected to the shared-load stage.

3. The comparator of claim 2, wherein the active-load p-channel transistors comprise:
   a first p-type active-load transistor having a gate node and a drain node connected to the drain node of the one of the first and second n-type transistors; and
   a second p-type active-load transistor having a gate node connected to the drain node of the one of the first and second n-type transistors and a drain node connected to the shared-load stage.

4. The comparator of claim 2, wherein
   the first p-type transistor of the input p-channel transistors has a gate node connected to receive the positive input component, and a second p-type transistor of the input p-channel transistors has a gate node connected to receive the negative input component; and
   the n-channel active-load transistors are connected to a drain node of one of the first and second p-type transistors, wherein at least one of the active-load transistors is connected to the shared-load stage.

5. The comparator of claim 4, wherein the active load n-channel transistors comprise:
   a first n-type active-load transistor having a gate node and a drain node connected to the drain node of the one of the first and second n-type transistors; and
   a second n-type active-load transistor having a gate node connected to the drain node of the one of the first and second n-type transistors and a drain node connected to the shared-load stage.

6. The comparator of claim 1, wherein the shared-load stage comprises:
   at least one p-type shared-load transistor and one n-type shared-load transistor, each shared-load transistor connected to the p-type input stage, the n-type input stage, and the output stage.

7. The comparator of claim 6, wherein:
   a p-type shared-load transistor has a gate and a drain connected to the p-type input stage, the n-type input stage, and the output stage; and
   an n-type shared-load transistor has a gate and a drain connected to the p-type input stage, the n-type input stage, and the output stage.

8. The comparator of claim 1, wherein:
   the p-type input stage is configured to be inactive, if the common-mode voltage of the differential input signal is greater than (Vdd−$V_{dsatP}$−$V_{thP}$), where Vdd is a power supply voltage applied to the power rail for the comparator, $V_{dsatP}$ is the minimum voltage drop across the current source, when the current source is operating properly, and $V_{thP}$ is the threshold voltage of the p-type transistors, and
   the n-type input stage is configured to be inactive, if the common-mode voltage of the differential input signal is less than ($V_{dsatN}$+$V_{thN}$), where $V_{dsatN}$ is the minimum voltage drop across the current sink, when the current sink is operating properly, and $V_{thN}$ is the threshold voltage of the n-type transistors.

9. The comparator of claim 1, wherein when one of the p-type and n-type stages is inactive, the remaining stage operates with no more than 9 active transistors.

10. The comparator of claim 1, wherein the transistors are field-effect transistors.

11. The comparator of claim 1, wherein the comparator circuit comprises no more than 14 transistors.

12. A comparator, comprising:
   an NMOS-input stage comprising a differential pair of source-coupled n-type transistors and one or more NMOS-input stage active-load transistors, wherein a first of the source-coupled n-type transistors is electrically connected via its gate node to a positive differential input node and a second of the n-type transistors is electrically connected at its gate node to a negative input node, wherein the NMOS-input stage active-load transistors have their gates connected together and to a drain of one of the differential pair of source-coupled n-type transistors, and the sources of the differential pair of source-coupled n-type transistors are connected to a current sink;
   a PMOS-input stage comprising a differential pair of source-coupled p-type transistors and one or more PMOS-input stage active-load transistors, wherein a first of the source-coupled p-type transistors is electrically connected via its gate node to the positive differential input node and a second of the source-coupled p-type transistors is electrically connected via its gate node to the negative input node, wherein the PMOS-input stage active-load transistors have their gates connected together and to a drain of one of the differential pair of source-coupled p-type transistors, and the sources of the differential pair of source-coupled p-type transistors are connected to a current source;
   a shared-load stage comprised of first and second active-load transistors that are electrically connected between the PMOS-input stage and the NMOS-input stage, wherein the first active-load transistor of the shared-load stage has a source connected to the sources of the NMOS-input stage active-load transistors, a drain connected to the drain of one of the differential pair of source-coupled n-type transistors of the NMOS input stage, and a gate connected to its drain, and the second active-load transistor of the shared-load stage is connected between the active-load transistors of the NMOS- and PMOS-input stages; and
   an output stage that includes no more than two transistors, wherein gates of the output stage transistors are electrically connected to gates of the first and second active-load transistors of the shared-load stage,
   wherein in operation, when the NMOS-input stage is active, the current is drawn through at least one of the active-load transistors within the shared-load stage, and when the PMOS-input stage is active, the current is drawn through the same at least one of the active-load transistors within the shared-load stage.

13. The comparator of claim 12, wherein when the common-mode voltage is very high or very low, only one of the PMOS- and NMOS-input stages is operational.

14. The comparator of claim 13, wherein within the operational stage has no more than nine (9) transistors are active at a time.

15. The comparator of claim 12, wherein the transistors are bipolar.

* * * * *